United States Patent [19]

Bar-David

[11] Patent Number: 5,235,290

[45] Date of Patent: Aug. 10, 1993

[54] METHOD AND APPARATUS FOR SMOOTHING OUT PHASE FLUCTUATIONS IN A MONITORED SIGNAL

[76] Inventor: Israel Bar-David, 13 Golda Meir Street, 34982 Haifa, Israel

[21] Appl. No.: 883,312

[22] Filed: May 14, 1992

[51] Int. Cl.⁵ .......................................... H03L 7/087
[52] U.S. Cl. ................................. 331/1 A; 331/11; 331/25; 307/516; 328/133
[58] Field of Search ............... 331/1 A, 11, 12, 25, 331/27; 307/516; 328/133

[56] References Cited

U.S. PATENT DOCUMENTS 3,703,686 11/1972 Hekimian ............................ 331/11
4,587,496 5/1986 Wolaver ............................ 331/1 A
4,940,952 7/1990 Kegasa ................................ 331/11

*Primary Examiner*—Siegfried H. Grimm
*Attorney, Agent, or Firm*—Benjamin J. Barish

[57] ABSTRACT

A method and apparatus for smoothing out phase fluctuations in a monitored input signal by: detecting the partial-cycle differences in phase between the input signal and a reference signal, and generating a first error signal representing the partial-cycle differences in phase; detecting full-cycle differences in phase between the input signal and the reference signal, and generating a second error signal representing the full-cycle differences in phase; and utilizing the first and second error signals for smoothing out the phase fluctuations in the input signal.

10 Claims, 2 Drawing Sheets

Extended Range Phase Lock Loop

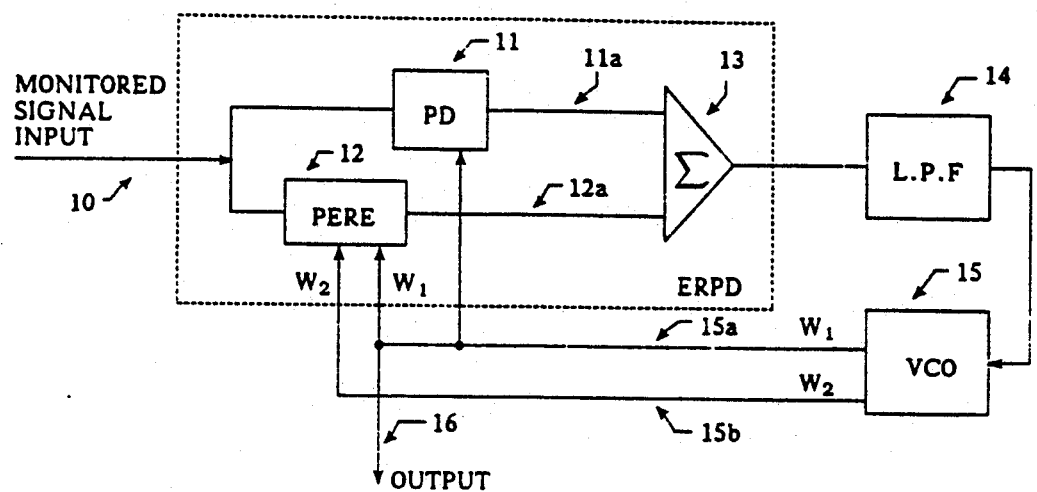
Fig 1 : Extended Range Phase Lock Loop
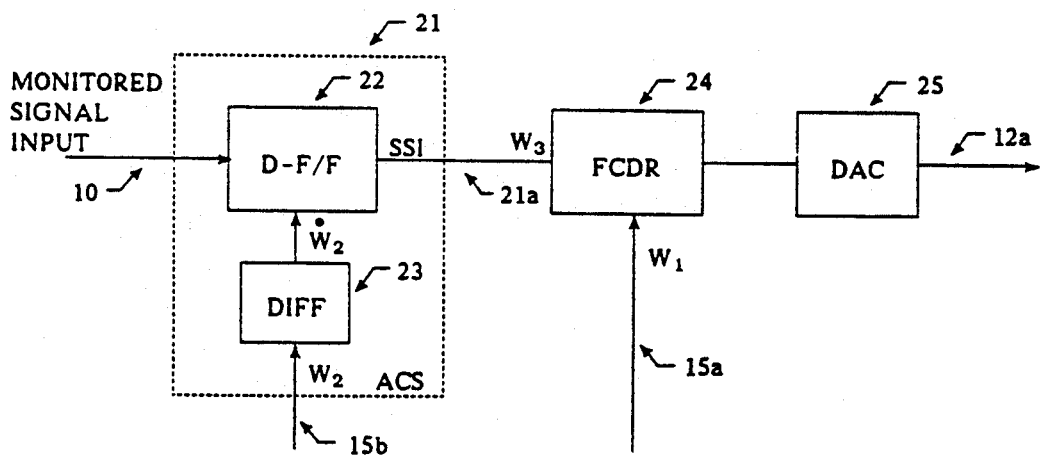
Fig 2 : Phase Error Range Extender

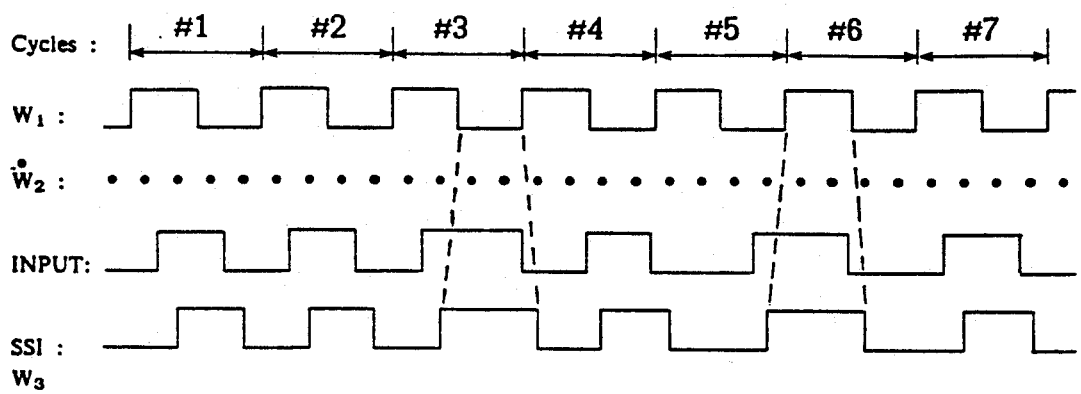
Fig 3 : Phase Error Range Extender Waveforms
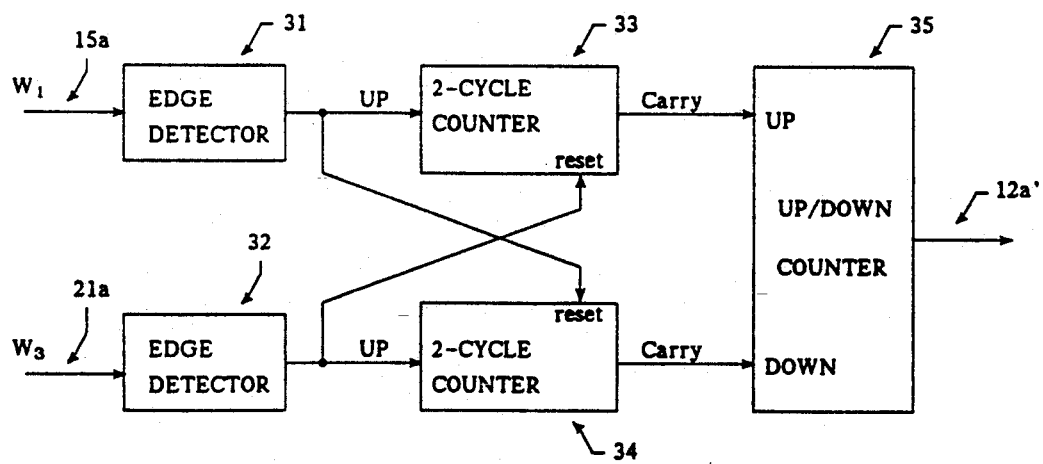
Fig 4 : Full Cycle Difference Register (FCDR)

METHOD AND APPARATUS FOR SMOOTHING OUT PHASE FLUCTUATIONS IN A MONITORED SIGNAL

FIELD AND BACKGROUND OF THE INVENTION

The present invention relates to a method and apparatus for smoothing out phase fluctuations in a monitored input signal. The invention is particularly useful for smoothing out very large phase fluctuations, that is, phase fluctuations exceeding a full cycle.

The invention may thus be used for rapidly acquiring the frequency of a signal and for subsequently tracking its time-averaged mean in the presence of very large phase fluctuations (i.e., having a magnitude of a number of full revolutions or cycles) about the mean. The invention is particularly useful where: (a) the frequency of the monitored input signal is initially offset from a nominal value and has a slowly drifting component which has to be accurately tracked by a local voltage-controlled oscillator (VCO); and/or (b) the monitored input signal includes a rapidly fluctuating component about the mean value, with phase excursions of possibly several cycles' magnitude which have to be smoothed out.

In both cases, after acquiring the frequency of the monitored input signal, the local VCO should follow a smooth, virtual phase-path, such that the positive phase excursions from it cancel the negative ones on the average.

Traditional frequency tracking apparatus are generally based on phase-locked loops (PLL). The conventional PLL includes a reference signal generator for generating a reference frequency, a phase detector for detecting differences in phase between the reference frequency and the input signal to be tracked in frequency, and a control circuit utilizing the differences in phase for smoothing out the phase fluctuations in the monitored input signal. Conventional phase detectors, however, are limited in the range of their outputs and thus indicate only partial-cycle phase differences, i.e., phase differences of less than a full cycle (360°). Phase differences of more than a full cycle (i.e., full-cycle phase differences) are not recorded by the conventional phase detectors, and therefore such full-cycle phase differences may result in undesirable "cycle slips".

Unrecorded cycle slips hamper the acquisition of signal frequencies having large initial offsets from the normal frequency and prevent the possibility of accurate tracking the signal's mean frequency. Phase fluctuations of several cycles in magnitude may be present in a number of situations, for example in the Token Ring Computer Communication Networks, where many stations are cascaded on a loop. In such networks, the phase jitter caused by thermal noise, cross-talk, and other disturbances, can add up to multiple-cycle magnitudes.

OBJECTS AND BRIEF SUMMARY OF THE INVENTION

An object of the present invention is to provide a method and also an apparatus for smoothing out phase fluctuations in a monitored input signal to avoid such "cycle slips" that may be produced in the presence of large, rapid phase fluctuations.

According to one aspect of the present invention, there is provided a method of smoothing out phase fluctuations in a monitored input signal, comprising detecting the partial-cycle differences in phase between the input signal and a reference signal, and generating a first error signal representing the partial-cycle differences in phase. The input signal is then stylized and synchronized such that its transitions from negative to positive levels, and from positive to negative levels, occur in synchronism with the reference signal. The so-produced synchronized and stylized input signal is slightly delayed such that its transitions do not coincide with those of the reference signal. The full-cycle differences in phase between the input signal and the reference signal are detected by counting the number of times that the phase of the input signal has overtaken the phase of the reference signal, less the number of times the phase of the reference signal has overtaken the phase of the input signal, and a second error signal is generated representing the full-cycle differences in phase. The first and second error signals are utilized for smoothing out the phase fluctuations in the input signal.

According to further features in the described preferred embodiment, the first and second error signals are summed, and the sum is passed through a lowpass filter before being used for smoothing out the phase fluctuations in the input signal.

In the described preferred embodiment, the reference signal is generated by a voltage-controlled oscillator, and the first and second error signals are utilized to control the frequency of the voltage-controlled oscillator.

The invention also provides apparatus, particularly a phase-locked loop, for smoothing out phase fluctuations in a monitored input signal according to the above method.

The method and apparatus of the present invention may thus be used wherever large (multi-cycle) undesirable phase fluctuations are present. One example of an application of the method and apparatus of the present invention is as a so-called "Jitter Buster" in Token Ring Computer Communication Networks, where many stations are cascaded on a loop such that the phase jitter caused by thermal noise, cross-talk, and other disturbances add up to multiple-cycle magnitudes.

Further features and advantages of the invention will be apparent from the description below.

BRIEF DESCRIPTION OF THE DRAWINGS

The invention is herein described, by way of example only, with reference to the accompanying drawings, wherein:

FIG. 1 is a block diagram illustrating one form of phase-locked loop constructed in accordance with the present invention;

FIG. 2 is a block diagram illustrating one form of phase-error range extender (PERE) circuit that may be used in the phase-locked loop of FIG. 1;

FIG. 3 is a waveform diagram helpful in understanding the operation of the PERE circuit of FIG. 2; and FIG. 4 is a block diagram illustrating a full-cycle difference register (FCDR) circuit used in the PERE circuit of FIG. 2.

DESCRIPTION OF A PREFERRED EMBODIMENT

The phase locked loop circuit illustrated in FIG. 1 is capable of detecting and tracking not only partial-cycle differences in phase as in a conventional phase-locked loop, but also full-cycle differences in phase. This circuit may therefore be called an Extended Range Phase Locked Loop (ERPLL).

The ERPLL circuit illustrated in FIG. 1 has an input 10 for receiving the monitored input signal. The mean (time average) frequency of this input signal is to be tracked, and the phase jitter of this signal is to be smoothed. A conventional phase detector (PD) 11 detects the partial-cycle differences in phase between the input signal and a reference signal, and produces a first error signal, namely an error voltage, on its output line 11a representing the partial-cycle differences in phase.

The circuit illustrated in FIG. 1 further includes a phase error range extender (PERE) circuit 12. This circuit receives the input signal 10, and also the reference signal. It detects the full-cycle differences in phase between the two signals, and generates a second error signal, in the form of an error voltage, on its output line 12a, representing the full-cycle differences in phase.

The two error voltages on lines 11a and 12a are summed in an adder circuit 13. The sum is passed through a lowpass filter 14 and then fed to a voltage-controlled oscillator (VCO) 15. The VCO generates the reference signal ($w_1$), the frequency of which is controlled by the error signal outputted from the lowpass filter 14. Thus, the signal $w_1$ outputted by the VCO 15 represents the monitored input signal inputted via line 10 to the illustrated phase-locked loop, but whose fluctuations have been smoothed out by the outputs of the partial-cycle phase-detector circuit PD 11, and the full-cycle phase-detector circuit PERE 12. The so-smoothed output signal $w_1$ appears on output line 16.

The VCO 15 supplies two signals to the two phase detectors PD 11 and PERE 12. One signal ($w_1$), at the nominal frequency of the input signal (input line 10), is supplied via its output line 15a to both phase detector circuits PD 11 and PERE 12. A second signal ($w_2$), exactly twice the frequency of signal $w_1$, is outputted from the VCO 15 via its output line 15b to the full-cycle phase difference detector PERE 12. The purpose of the second signal $w_2$, at exactly twice the nominal frequency of the input signal $w_1$, is to supply four equally-spaced transition points per cycle of the reference signal $w_1$ to the PERE circuit 12, for a purpose to be described more particularly below.

One way of obtaining the two output signals $w_1$, $w_2$ from the VCO 15, is to operate the VCO at twice the nominal input-signal frequency ($w_1$) such that the direct output of the VCO is the signal $w_2$, and to incorporate in the VCO 15 a frequency divider that outputs the signal $w_1$. An alternative way of obtaining the two output signals from the VCO is to use a VCO that operates at the input signal frequency and has two quadrature outputs; in such a case, the signal $w_1$ is one of the quadrature outputs, and the signal $w_2$ is obtained from the product of the two quadrature components.

FIG. 2 illustrates one manner of implementing the PERE circuit 12 of FIG. 1. This circuit, as mentioned earlier, detects the full-cycle differences in phase between the monitored signal on input line 10 and the reference signal $w_1$ from the VCO 15. More particularly, the PERE circuit 12 counts the running sum of the number of times the phase of the monitored signal inputted on line 10 overtakes the phase of the reference signal $w_1$ from the VCO, less the number of times the reference signal $w_1$ from the VCO overtakes the monitored input signal; and converts this number into a voltage.

The main problem in implementing such a function is that practical time-comparison circuits have finite-duration and often varying transition behaviour. This fact can cause erratic counting of the events described above. In order to avoid this problem, an anti-coincidence synchronizer ACS, represented by the broken-line box 21 in FIG. 2, is provided at the front end of the PERE circuit 12 (FIG. 1). The function of the ACS circuit 21 is to stylize and synchronize the input signal such that its transitions from negative to positive levels, and from positive to negative levels, occur in synchronism with the reference signal $w_1$ from the VCO 15, and thereby avoid missing any level transitions. The so-obtained stylized and synchronized input (SSI) signal is outputted as signal $w_3$ on output line 21a from the ACS circuit 21.

The ACS circuit 21 illustrated in FIG. 2 samples the input signal on input line 10 four times per cycle of the reference signal $w_1$ outputted from line 15a of the VCO 15. This operation is implemented by a D-flip-flop (D-F/F) circuit 22 as controlled by a differentiating (DIFF) circuit 23. Thus, the DIFF circuit 23 receives the double-frequency signal $w_2$ via the output line 15b from the VCO 15 and generates trigger pulses $w_2$ from the double-frequency reference signal $w_2$ at the positive and negative sign changes of the latter signal. The output pulses $w_2$ trigger the D-F/F circuit 22 in synchronism with the reference signal $w_1$ but with a slight delay such that the transitions of the input signal do not coincide with those of the reference signal, to produce the stylized and synchronized input SSI signal $w_3$ in the output line 21a.

The foregoing operations are more particularly illustrated for a hypothetical situation in the waveforms illustrated in FIG. 3. As shown in FIG. 3, during each of the third and sixth cycles of the reference signal $w_1$, the stylized and synchronized output signal $w_3$ loses one-half cycle. This is apparent by the fact that, during all the other cycles, the edges of signals $w_1$ and $w_3$ alternate regularly. However, in each of the third and sixth cycles, two edges of signal $w_1$ are bracketed between those of signal $w_3$. Following the sixth cycle, a pattern similar to that in the first cycle is apparent.

Thus, a full cycle difference can be registered. This can be accomplished, by way of example, by using the Full-Cycle Difference Register (FCDR) circuit 24 in FIG. 2, which circuit also receives the reference signal $w_1$ via output line 15a from the VCO 15. The output of the FCDR circuit 24 is converted to an analog value via the DAC (digital-to analog converter) circuit 25. The output of the latter circuit represents an error voltage corresponding to the full-cycle differences in phase between the monitored input signal on input line 10 and the reference signal ($w_1$), and is inputted, with the partial-cycle error voltage signal from the conventional phase detector 11, to the summer circuit 13 (FIG. 1).

FIG. 4 illustrates one implementation of the FCDR (full-cycle difference register) circuit 24 of FIG. 2.

The FCDR circuit 24 illustrated in FIG. 4 includes a first edge detector circuit 31 receiving the reference signal $w_1$ outputted via line 15a from the VCO 15, and a second edge detector circuit 32 receiving the stylized and synchronized input (SSI) signal $w_3$ on output line 21a from the ACS circuit 21. The FCDR circuit 24 illustrated in FIG. 4 further includes a first two-cycle counter 33 which is set by the output of edge detector 31 and reset by the output of edge detector 32, and a second two-cycle counter 34 which is set by the output from the edge detector 32 and reset by the output from the edge detector 31.

Circuit FCDR 24 of FIG. 2 further includes an up-down counter 35. This counter counts UP for each carry of counter 33 and counts DOWN for each carry from counter 34. Thus, only if two edges of one of the two waveforms $w_1$, $w_3$ occur before one edge of the other waveform, is an appropriate carry output passed to the up-down counter 35. The latter counter registers the required number of differential (positive and negative) full cycle counts. This count appears as a digital value in output line 12a' of counter 35, and is converted to an analog value by the DAC circuit 25 in FIG. 2. The output 12a of the latter circuit 25 thus represents the error voltage corresponding to the full-cycle differences in phase between the monitored input signal on line 10 and the reference signal $w_1$ from the VCO 15.

As described above with respect to FIG. 1, the error voltage 12a is summed with the error voltage 11a from the partial-cycle phase detector 11, and the sum, after passing through the lowpass filter 14, is used for controlling the frequency of the VCO 15.

While the invention has been described with respect to one preferred embodiment, it will be appreciated that this is set forth merely for purposes of example, and that many variations of the invention may be made. For example, the entire function of the PERE circuit 12 can be implemented as a single finite state logic device using a programmable logic array (PAL). This is feasible since, as can be seen from the waveforms in FIG. 3, at the edges of waveform $w_2$ which serve as sampling points, the waveforms $w_1$ and $w_3$ can be in only one of four distinct states: both up, both down, first up second down, or first down second up. Irregularities in the sequences of these states can be used to indicate full cycle differences.

The method and apparatus of the present invention can be used to reduce the accumulated phase jitter in Token Ring computer communication networks even if the excursions of the phase are larger than several full cycles (unit intervals). This is achieved by the FCDR, which allows the ERPLL circuit (of FIG. 1) to have a sufficiently narrow bandwidth such that the VCO 15 can follow only the slowly varying mean frequency of the input signal and registers the exact number of cycle slips that may have occurred because of the large phase jitter.

Many other variations, modifications and application of the invention will be apparent.

What is claimed is:

1. A method of smoothing out phase fluctuations in a monitored input signal, comprising:
    detecting the partial-cycle differences in phase between said input signal and a reference signal, and generating a first error signal representing said partial-cycle differences in phase;
    stylizing and synchronizing said input signal such that its transitions from negative to positive levels, and from positive to negative levels, occur in synchronism with said reference signal, and slightly delaying said so-produced synchronized and stylized input signal such that its transitions do not coincide with those of the reference signal;
    detecting full-cycle differences in phase between said input signal and said reference signal by counting the number of times that the phase of the input signal has overtaken the phase of the reference signal, less the number of times the phase of the reference signal has overtaken the phase of the input signal, and generating a second error signal representing said full-cycle differences in phase;
    and utilizing said first and second error signals for smoothing out the phase fluctuations in said input signal.

2. The method according to claim 1, wherein said first and second error signals are summed, and the sum is passed through a lowpass filter before being used for smoothing out the phase fluctuations in said input signal.

3. The method according to claim 1, wherein said reference signal is generated by a voltage-controlled oscillator, and said first and second error signals are utilized to control the frequency of said voltage-controlled oscillator.

4. Apparatus for smoothing out phase fluctuations in a monitored input signal, comprising:
    a reference signal generator for generating a reference signal;
    a first detector for detecting the partial-cycle differences in phase between said input signal and said reference signal, and for generating a first error signal representing said partial-cycle differences in phase;
    a second detector for detecting full-cycle differences in phase between said input signal and said reference signal, and for generating a second error signal representing said full-cycle differences in phase, said second detector including an anti-coincidence synchronizing circuit for stylizing and synchronizing said input signal such that its transitions from negative to positive levels, and from positive to negative levels, occur in synchronism with said reference signal, and for slightly delaying said stylized and synchronized input signal such that its transitions do not coincide with those of the reference signal;
    and a control circuit utilizing said first and second error signals for smoothing out the phase fluctuations in said monitored input signal.

5. The apparatus according to claim 4, wherein said control circuit includes:
    a summer circuit for summing said first and second error signals, and for producing an error-sum signal;
    and a lowpass filter for filtering said error-sum signal before it is used for smoothing out the phase fluctuations in said monitored input signal.

6. The apparatus according to claim 4, wherein said anti-coincidence synchronizing circuit includes:
    a flip-flop receiving said input signal;
    and a triggering circuit receiving said reference signal and for triggering the flip-flop four times for each cycle of the reference signal.

7. The apparatus according to claim 6, wherein said triggering circuit includes a differentiator circuit receiving a synchronizing signal equal to double the frequency of the reference signal and outputting trigger pulses to said flip-flop at the positive and negative sign changes of said synchronizing signal.

8. The apparatus according to claim 4, wherein said second detector further includes a full-cycle differential register which registers the number of times the phase of the input signal overtakes the phase of the reference signal, less the number of times the phase of the reference signal overtakes the phase of the input signal.

9. The apparatus according to claim 8, wherein said full-cycle differential register comprises:
   a first edge detector which outputs pulses at the edges of said reference signal;
   a second edge detector which outputs pulses at the edges of a second signal of twice the frequency of said reference signal;
   a first two-cycle counter which is set by the output pulses of said first edge detector and is reset by the output pulses of said second edge detector;
   a second two-cycle counter which is set by the output pulses of said second edge detector and is reset by the output pulses of said first edge detector;
   and an up-down counter counting up for each carry of the first two-cycle counter, and counting down for each carry of the second two-cycle counter.

10. The apparatus according to claim 4, wherein said reference signal generator is a voltage-controlled oscillator, and said control circuit utilizes said first and second error signals for controlling the frequency of said voltage-controlled oscillator.

* * * * *